United States Patent
Okada

(10) Patent No.: US 7,321,392 B2
(45) Date of Patent: Jan. 22, 2008

(54) SOLID STATE IMAGING DEVICE WITH LATERAL OVERFLOW DRAIN AND DRIVING METHOD THEREOF ACHIEVING LOW POWER CONSUMPTION

(75) Inventor: Yoshihiro Okada, Hashima (JP)

(73) Assignee: Sanyo Electric Co., Ltd., Osaka (JP)

( * ) Notice: Subject to any disclaimer, the term of this patent is extended or adjusted under 35 U.S.C. 154(b) by 813 days.

(21) Appl. No.: 10/712,466

(22) Filed: Nov. 13, 2003

(65) Prior Publication Data

US 2004/0095491 A1    May 20, 2004

(30) Foreign Application Priority Data

Nov. 15, 2002   (JP) .............................. 2002-332571

(51) Int. Cl.
*H04N 3/14*      (2006.01)
*H01L 29/768*    (2006.01)
(52) U.S. Cl. ....................................... 348/314; 257/230
(58) Field of Classification Search ................ 348/314; 257/230, 232
See application file for complete search history.

(56) References Cited

U.S. PATENT DOCUMENTS 4,696,021 A * 9/1987 Kawahara et al. ............ 377/58
4,995,061 A * 2/1991 Hynecek ....................... 377/58
5,057,926 A * 10/1991 Watanabe ..................... 348/314
6,369,413 B1 * 4/2002 Hynecek ..................... 257/215
6,573,937 B1   6/2003 Nakashiba

FOREIGN PATENT DOCUMENTS

JP        10-326887        12/1998

* cited by examiner

*Primary Examiner*—Tuan Ho
*Assistant Examiner*—Dillon Durnford-Geszvain
(74) *Attorney, Agent, or Firm*—Hogan & Hartson LLP

(57) ABSTRACT

A solid state imaging device comprises channel regions of one conductivity type arranged to extend along a first direction in parallel to each other with predetermined intervals on one surface of a semiconductor substrate, drain regions of the one conductivity type at high doping density, which are arranged to extend along the first direction between adjacent channel regions, separation regions disposed in the interval between one of the channel regions and one of the drain regions, and transfer electrodes arranged in parallel to each other to extend along a second direction which intersets the first direction on the semiconductor substrate. The width of the separation region is narrower in a region beneath at least one transfer electrode in each predetermined set of transfer electrodes than in a region beneath the remaining transfer electrodes in the set of transfer electrodes.

5 Claims, 6 Drawing Sheets

SOLID STATE IMAGING DEVICE WITH LATERAL OVERFLOW DRAIN AND DRIVING METHOD THEREOF ACHIEVING LOW POWER CONSUMPTION

BACKGROUND OF THE INVENTION

1. Field of the Invention

The present invention relates to a CCD solid state imaging device with a lateral overflow drain structure and a driving method thereof, and more particularly to a device and method which reduce power consumption.

2. Description of Related Art

In a solid state imaging device, when excess information charges are generated in an imaging section, a phenomenon known as "blooming" in which information charges overflow into an adjacent pixel often occurs. In one antiblooming technique, an overflow drain structure is provided for discharging unnecessary information charges. The overflow drain structures include the vertical overflow drain and the lateral overflow drain.

Such a lateral overflow drain is used in frame transfer CCD solid state imaging devices. FIG. 5 schematically shows a configuration of a frame transfer CCD solid state imaging device. Referring to FIG. 5, a frame transfer CCD solid state imaging device 2 comprises an imaging section 2$i$, a storage section 2$s$, a horizontal transfer section 2$h$, and an output section 2$d$. A two-dimensional array of information charges generated in the imaging section 2$i$ is transferred at a high rate to the storage section 2$s$. The information charges, which are stored in the storage section 2$s$, are also transferred to the horizontal transfer section 2$h$ for every one row. Then, the information charges are further transferred from the horizontal transfer section 2$h$ to the output section 2$d$ pixel by pixel. The output section 2$d$ converts a charge amount for each pixel into a voltage as a CCD output.

Each of the imaging section 2$i$ and the storage section 2$s$ comprises a plurality of vertical shift registers composed of a plurality of channel regions extending in the vertical direction in parallel to each other and a plurality of transfer electrodes extending in the horizontal direction in parallel to each other.

In the case of a CCD solid state imaging device employing a lateral overflow drain structure, a drain region is formed between adjacent vertical shift registers.

FIG. 6 is a schematic plan view showing a part of the imaging section 2$i$ or the storage section 2$s$ of a frame transfer CCD solid state imaging device employing a conventional lateral overflow drain structure. In the approximately center position between adjacent channel regions 4 of a vertical shift register, a drain region 8 is formed, and a separation region 10 is formed between the drain region 8 and the channel region 4. The drain region 8 is disposed parallel to the channel region 4 and is formed by doping high density N-type dopant ions to have a predetermined width. The separation region 10 is formed by doping P-type dopant ions between the channel region 4 and the drain region 8. The separation region 10 creates a potential barrier between the channel region 4 and the drain region 8.

A transfer electrode 12 is formed on a semiconductor substrate via an oxide film so as to extend in the direction intersecting the channel region 4. A plurality of transfer electrodes 12 are disposed parallel to each other and are electrically insulated from each other. Each transfer electrode 12 receives a vertical transfer clock $\phi_f$. By applying a vertical transfer clock $\phi_f$ to the transfer electrode 12, the state of the potential well formed in the channel region 4 is controlled for sequentially transferring the accumulated information charge.

In the case of three-phase driving, for example, clock pulses $\phi_1$, $\phi_2$, and $\phi_3$ are applied to the transfer electrodes 12-1, 12-2, and 12-3, respectively. Namely, in the three-phase driving, three transfer electrodes 12-1 to 12-3 are designated as one pixel, and one light receiving pixel or an information charge is defined for each set of three transfer electrodes 12-1 to 12-3.

At the time of imaging, a clock pulse $\phi_2$, for example, is caused to rise to H level, and a potential well is formed beneath the transfer electrode 12-2 of the imaging section 2$i$. The information charges generated by incident light entering the semiconductor substrate moves to the neighboring potential well and is accumulated in the potential well.

Further, due to clock pulses $\phi_1$ to $\phi_3$ having different phases, the potential well formed beneath the transfer electrode 12 can be moved in a predetermined direction. Thus, the information charges stored in the potential well is transferred (in the downward direction in FIG. 6, for example) using the channel region 4 as a transfer path.

FIG. 7A is a schematic cross sectional view taken along line X-X of FIG. 6, and FIG. 7B shows the potential state at a portion corresponding to the cross section of FIG. 7A. Referring to FIG. 7A, an N well 20, an N$^+$ diffusion layer 22, and P$^-$ diffusion layer 24, respectively corresponding to the channel region 4, the drain region 8, and the separation region 10, are formed on a surface of a p type semiconductor substrate $P_{sub}$. On the substrate surface, the transfer electrode 12 is disposed via a gate oxide film 26. In FIG. 7B, the vertical axis indicates potential, with the positive potential increasing in the downward direction. The N well 20 may be placed in a depletion state by a voltage to the transfer electrode 12 to thereby create a potential well 30. The information charges 32 can be accumulated in the potential well 30. The N$^+$ diffusion layer 22 creates a positive potential drain 34, and the P$^-$ diffusion layer, which corresponds to the separation region 10, forms a potential barrier 36 between the potential well 30 of the transfer channel and the drain 34.

A discharge clock $\phi_b$ is applied to the drain region 8. The discharge clock is held to L level (5V, for example) at normal times. In such a state, the potential barrier 36 is created between the channel region 4 and the drain region 8. When a CCD solid state imaging device is exposed to very high intensity light and a large amount of information charges are generated in the channel region, for example, charges exceeding the storage capacity of the channel region spill over the potential barrier 36 into the drain region 8 and are discharged. As a result, blooming, in which excess charges spills over into adjacent pixels and cause image disturbance, can be prevented.

The above structure can also be used to operate an electronic shutter. In this operation, a discharge clock $\phi_b$ to be applied to the drain region 8 rises to H level, while a vertical transfer clock $\phi_f$ applied to the transfer electrode 12 falls to L level. Consequently, the depth of the potential well in the channel region 4 shallows and the barrier between the channel region 4 and the drain region 8 is lowered (see a dotted line 36 in FIG. 7($b$)). This causes the information charges to move along the slope of the potential, so that the information charges accumulated in the channel region 4 are collectively discharged into the drain region 8 via the separation region 10. With this operation, all the information charges stored in the imaging section 2$i$ and the storage section 2s are discharged and at this point in time, a new exposure period starts in the imaging section 2i.

SUMMARY OF THE INVENTION

In recent years, many small size and lightweight devices using a CCD solid state imaging device, such as digital cameras and mobile telephones with built in cameras, have been developed. In these small, light devices, because the battery size is also reduced, reduction in power consumption is desired. Conventionally, the voltage of a clock pulse applied to the drain region 8 for the operation of the lateral overflow drain is relatively high and therefore reduction in power consumption is required.

Here, reduction in the voltage of a clock pulse to be applied to the drain region would reduce power consumption in the lateral overflow drain. However, as long as a configuration including a conventional separation region is employed, it is not possible to sufficiently lower the potential barrier between the channel region and the drain region, which results in the discharging operation of excess charges and an electronic shutter operation being incomplete.

If the width of the separation region is decreased, on the other hand, it is possible to perform the intended exceed charge discharging operation or electronic shutter operation even when the voltage of a clock pulse is low. In this case, however, the potential barrier created between the drain region and the channel region is lowered, leading to a problem that the information charge, while being transferred within the vertical shift register, spills over into the drain region and is decreased.

In accordance with one aspect of the present invention, there is provided a solid state imaging device comprising channel regions of one conductivity type arranged to extend along a first direction in parallel to each other and separated by predetermined intervals on one surface of a semiconductor substrate, drain regions of the one conductivity type at high doping density, which are arranged to extend along the first direction between the adjacent channel regions, separation regions disposed in the interval between one of the channel regions and one of the drain regions, and transfer electrodes arranged in parallel to each other to extend along a second direction which intersects the first direction on the semiconductor substrate, wherein the width of the separation region is narrower in a region beneath at least one transfer electrode in each set of an predetermined number of transfer electrodes than in a region beneath the remaining transfer electrodes.

In accordance with another aspect of the present invention, there is provided a method of driving a solid state imaging device comprising channel regions arranged on one surface of a semiconductor substrate in parallel to each other and separated by predetermined intervals, drain regions each provided between the adjacent channel regions, separation regions provided in an interval between one of the channel regions and one of the drain regions, and transfer electrodes provided on the semiconductor substrate, the width of the separation region being narrower in a region beneath at least one transfer electrode in each set of an predetermined number of transfer electrodes than in a region beneath the remaining transfer electrodes, the method comprising the steps of rising a first clock pulse to be applied to a transfer electrode which is formed on the part of the separation region having the narrower width of the plurality of transfer electrodes in order to accumulate information charges in the channel region adjacent to the part of the separation region having the narrower width, and applying a clock pulse which periodically changes a potential to the plurality of transfer electrodes in order to transfer the information charges accumulated in the above accumulation step.

BRIEF DESCRIPTION OF THE DRAWINGS

These and other objects of the invention will be explained in the description below, in connection with the accompanying drawings, in which.

DETAILED DESCRIPTION OF THE PREFERRED EMBODIMENT

Figure 5:
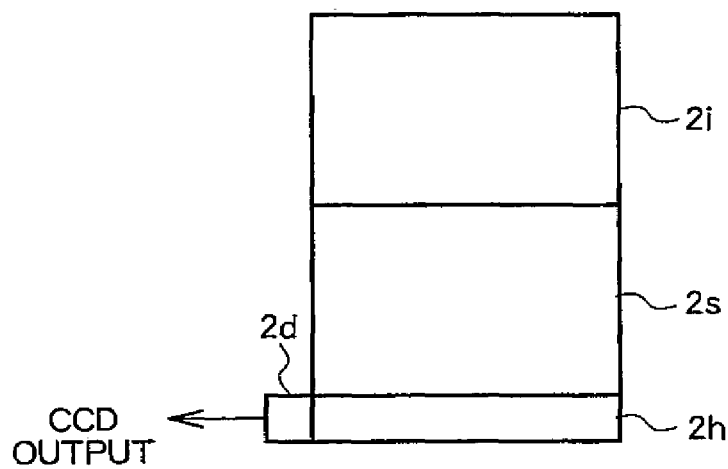
FIG. 5 is a schematic structural view of a frame transfer CCD solid state imaging device.

A frame transfer CCD solid state imaging device will be described in further detail in the following as an example of a preferred embodiment of the present invention, with reference to the accompanying drawings. A schematic configuration of a frame transfer CCD solid state imaging device is as shown in FIG. 5. More specifically, a frame transfer CCD solid state imaging device comprises an imaging section 2i, a storage section 2s, a horizontal transfer section 2h, and an output section 2d. The imaging section 2i includes a plurality of shift registers extending along the vertical direction in parallel to each other, and each bit in each shift register may be a light receiving pixel to be worked as a photo diode. The storage section 2s includes a plurality of light shielding shift registers continuous to the shift registers of the imaging section 2i, and each bit in each shift register may be a storage pixel. The horizontal transfer section 2h is formed by a single shift register extending in the horizontal direction, and the output of each shift register of the storage section 2s is connected to each bit of the horizontal transfer section 2h. The output section 2d includes a capacitor for temporarily storing a charge transferred and output from the horizontal transfer section 2h and a reset drain for discharging a charge stored in the capacitor. With the above configuration, information charges accumulated in each light receiving pixel of the imaging section 2i are transferred to a storage pixel of the storage section 2s independently pixel by pixel. The information charges thus transferred to the storage section 2s are then transferred for each row to the horizontal transfer section 2h, and is further transferred in each pixel unit to the output section 2d. In the output section 2d, the charge amount is converted into a voltage for each pixel, and a change in the voltage is supplied to an external circuit as a CCD output.

A drain region is provided between the channel regions of a plurality of vertical shift registers forming the imaging section 2i and the storage section 2s, so that a lateral state overflow drain structure is incorporated in the CCD solid imaging device.

Figure 1:
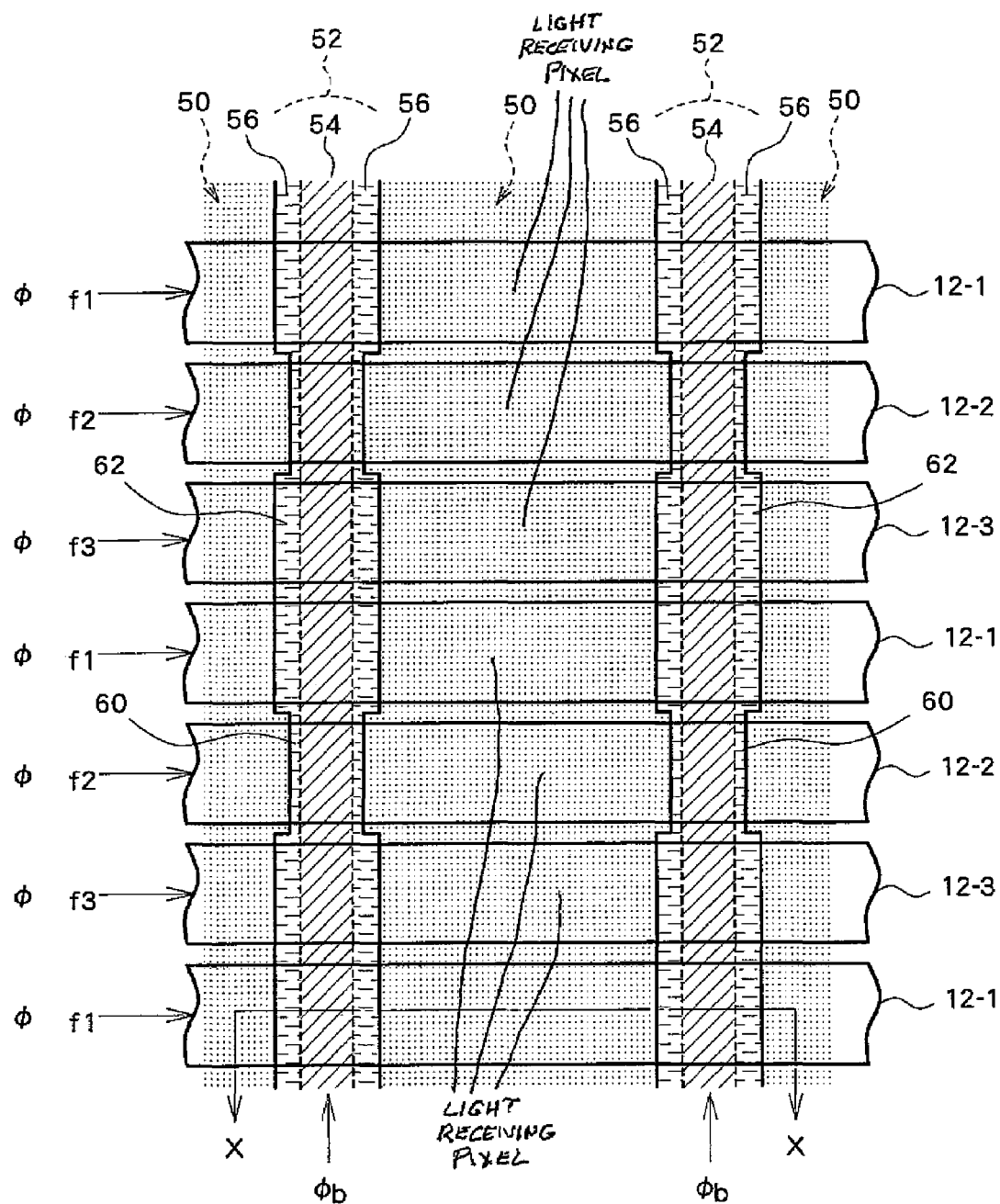
FIG. 1 is a schematic plan view showing a part of an imaging section or a storage section of a frame transfer CCD solid state imaging device employing a lateral overflow drain structure according to an embodiment of the present invention.

FIG. 1 is a plan view schematically showing part of the imaging section 2i or the storage section 2s of a frame transfer CCD solid state imaging device employing a lateral overflow drain structure. Drain regions 54 are provided in the approximately center position between the adjacent channel regions 50 of the vertical shift register. Separation regions 56 are provided between one of the drain regions 54 and one of the channel regions 50. The drain region 54 is disposed parallel to the channel region 50 and is formed by doping high density N-type dopant ions to have a predetermined width. The separation region 56 is formed by doping P-type dopant ions between the channel region 50 and the drain region 54 and therefore creates a potential barrier between the channel region 50 and the drain region 54.

The CCD solid state imaging device of the present embodiment has a significant structural feature in which part of the separation region 56 is formed to have a narrower width and the potential barrier formed between the channel region 50 and the drain region 54 is thin at these portions. Hereinafter, such a portion of the separation region 56 having a narrower width will be referred to as a first region 60 and the remaining portions in which the potential barrier is relatively thick will be referred to as a second region 62. In the configuration shown in FIG. 1, the separation region 52 is formed to be thinner at the first region than at other regions. More specifically, the width of the first region 60 may be approximately 0.1 to 0.2 μm and the width of the second region 62 may be approximately 0.3 to 0.5 μm which is substantially the same as the size of the conventional separation region. The drain region 54, on the other hand, may be formed to have a fixed width over its entire length, which is approximately 0.3 to 0.5 μm. As a result of examining the widths of the first region 60, the second region 62, and the drain region 54 taking the transfer efficiency and discharging efficiency of information charge into consideration, it can be seen that optimal widths of the first region 60, the second region 62, and the drain region 54 are approximately 0.2 μm, 0.4 μm, and 0.4 μm, respectively.

The CCD solid state imaging device of the present embodiment is a three-phase drive device, for example, in which transfer electrodes 12-1 to 12-3 to which vertical transfer clocks $\phi_1$, $\phi_2$, and $\phi_3$ are respectively applied are disposed on the above described channel region 50, the drain region 54 and the separation region 56 so as to extend in the direction intersecting the extending direction of these regions. In such three-phase driving, a set of three transfer electrodes, namely the transfer electrodes 12-1 to 12-3, corresponds to a single pixel in the imaging section 2i and the storage section 2s. The first region 60 is provided at a position where one of these three transfer electrodes, the transfer electrode 12-2, for example, is disposed. In this case, the length of the first region 60 (the size in the vertical direction in FIG. 1) is set so as to substantially correspond to the width of the transfer electrode 12-2. Further, a single first region 60 is provided for each set of three transfer electrodes corresponding to one pixel.

Thus, the potential barrier is more likely to be influenced by a voltage of the drain region in the first region 60 which is formed to have a narrower width than in the second region 62 which is formed to have a wider width. In other words, when clock pulses $\phi_1$, $\phi_2$, and $\phi_3$ are applied to the drain region and information charges are discharged from the channel region 50, it is possible to discharge charges into the first region 60, even when the clock pulses $\phi_1$, $\phi_2$, and $\phi_3$ have a relatively low voltage. In addition, because the first region 60 forms only a part of the separation region 56 and the remaining portion of the separation region 56 is formed by the second region 62, it is possible to transfer the information charges without decreasing the transfer efficiency.

Further, the first region 60 is provided at intervals in accordance with the arrangement cycle of pixels along the channel region 50. It is therefore possible to simultaneously discharge a plurality of information charges arranged in the channel region 50 via the first region 60.

Figure 2:
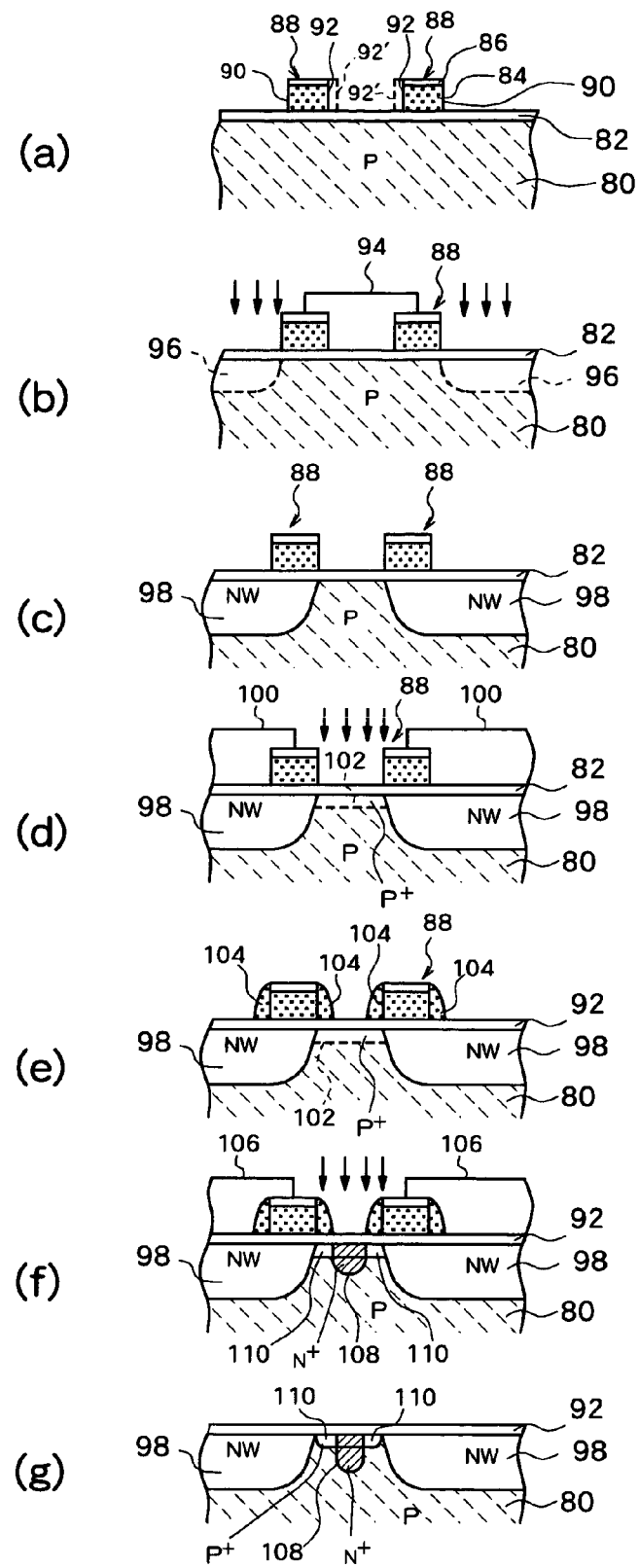
FIG. 2 is a process flowchart for explaining formation of a lateral overflow drain portion of a CCD solid state imaging device according to the embodiment of the present invention.

FIG. 2 is a process flowchart for explaining formation of the lateral overflow drain portion of the present device. After depositing an insulating film 82 on a P type semiconductor substrate 80($P_{sub}$), a polysilicon film and a nitride silicon film are further deposited thereon. Then, the polysilicon and the nitride silicon are patterned to form a mask 88 made of a lamination of the polysilicon 84 and the nitride silicon 86. The mask 88 is used in several ion doping processes which will be described below. One side 90 of the mask 88 defines a region for doping N type dopant ions which form the channel region 50, and the other side, 92 or 92' defines a region for doping P type dopant ions which form the separation region 52. Here, the side 92 corresponds to the second region 62 and the side 92' corresponds to the first region (see FIG. 2(a)).

A resist is then coated on the semiconductor substrate 80 on which the mask 88 has been formed and is exposed to light in order to form a resist pattern 94. The resist pattern 94 covers a portion of the substrate on which the separation region 52 is to be formed (a portion between opposing sides 92 and between opposing sides 92'). Using the mask 88 and the resist pattern 94 as masks, N type dopant ions are doped to form an N type region 96 (see FIG. 2(b)). The borderline of the N type region 96 is basically located under the side 90 of the mask 88. The N type region 96 is diffused by a heat treatment performed after removal of the resist pattern 94, thereby forming an N well 98 corresponding to the channel region 50 (see FIG. 2(c)). More specifically, the N type region 96 is pushed down into the depth direction and also extends in the horizontal direction, so that the N well 98 is formed in such a manner that its edge is located under the side 92 or 92' of the mask 88.

Then, a resist is coated on the semiconductor substrate 80 in which the N well 98 has been formed, to form a resist pattern 100. The resist pattern 100 covers a region where the N well 98 has been formed (a region between the opposing sides 90). P type dopant ions are doped using the resist pattern 100 and the mask 88 as masks, to form a $P^+$ diffusion layer 102 corresponding to the separation region 52. Because the side 92' projects further than the side 92, the width of the $P^+$ diffusion layer 102 formed between the sides 92' is narrower than the width of the $P^+$ diffusion layer 102 formed between the sides 92.

N type dopant ions for forming the drain region 54 are then doped in the center portion of the $P^+$ diffusion layer 102 in its width direction, leaving the remaining regions of the $P^+$ diffusion layer 102 as the separation region 56. In order to mask a very narrow width of the separation region 56 both in the first region 60 and the second region 62, side walls 104 are formed on each side of the mask 88 (see FIG. 2(*e*)). The side wall 104 is formed by depositing an oxide film on the semiconductor substrate 80 after removal of the resist pattern 100 and then treating an isotropic etching to the oxide film. The width of the side wall 104 determines the width of the separation region 56. The side wall 104 is formed such its width is narrower at a portion corresponding to the first region 60. For example, after formation of the oxide film, a mask having an opening between the opposing sides 92' is attached. The oxide film is etched to some extent with the mask attached and then is further etched after removing the mask. Thus, an etching amount for the oxide film may be increased in the portion corresponding to the side 92' than in the portion corresponding to the side 92, so that the width of the side wall 104 is reduced in the portion corresponding to the first region 60.

After the side wall 104 is thus formed, a resist is once again coated on the semiconductor substrate 80, and is then exposed to form a resist pattern 106. The resist pattern 106 covers the region where the N well 98 has been formed. Then, N type dopant ions are doped using the resist pattern 106, the mask 88, and the side wall 104 as masks in order to form an N$^+$ diffusion layer 108 corresponding to drain region 54 at the center of the region corresponding to the separation region 52 (see FIG. 2(*f*)). Further, in the P$^+$ diffusion layer 102, a P$^+$ diffusion layer 110 in which N type dopant ions have not been doped due to the mask by the side wall 104 remains as the separation region 56.

After the resist pattern 106, the nitride silicon 86, and the polysilicon 84 are sequentially removed (FIG. 2(*g*)), the transfer electrode and the protective film are formed according to the manufacturing processes similar to those for the conventional CCD solid state imaging device.

Figure 3:
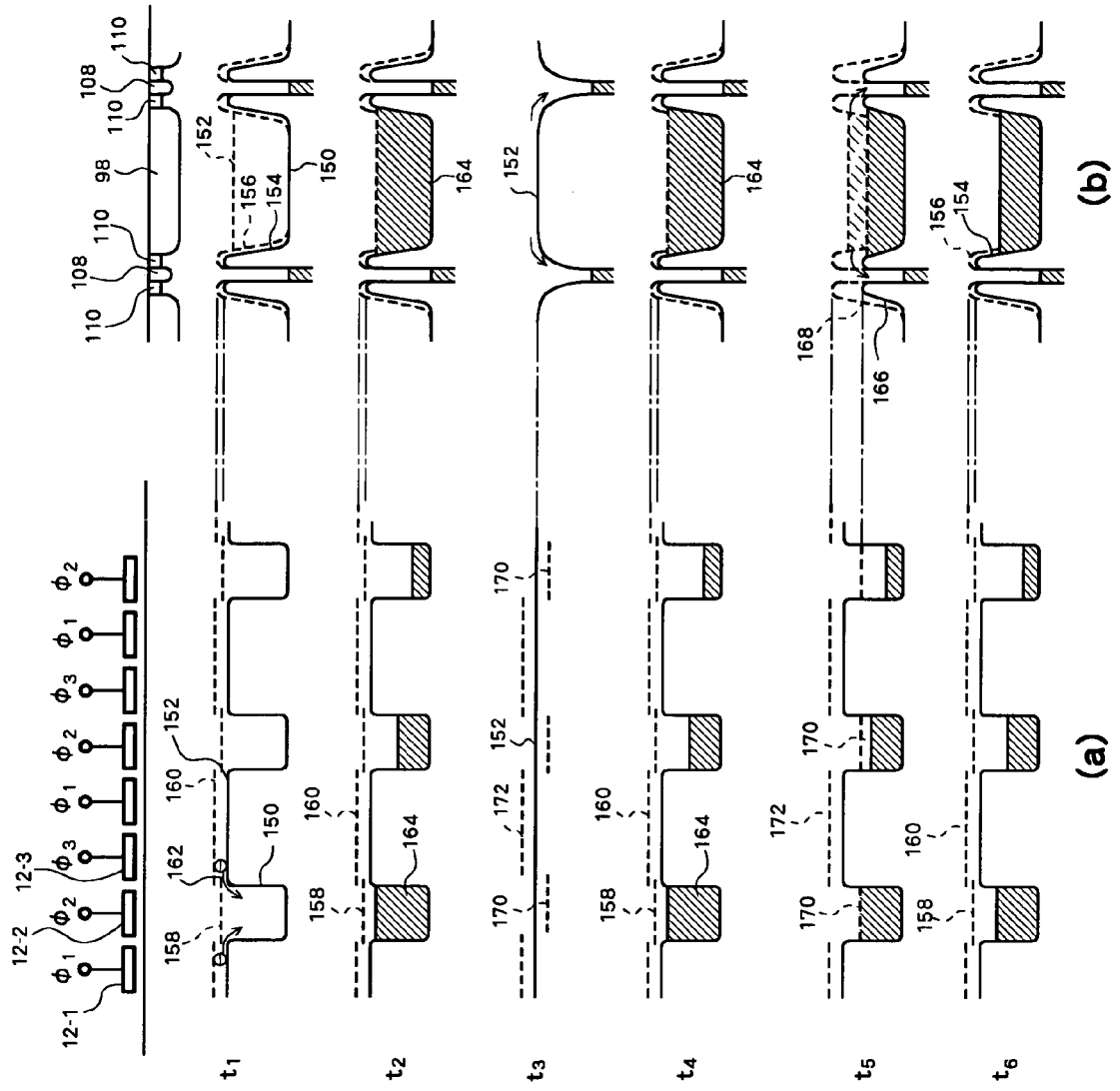
FIG. 3 is a potential distribution diagram at the vertical shift register for explaining an anti-blooming operation at the imaging section of the CCD solid state imaging device according to the embodiment of the present invention.

A driving method of the present device will be described. FIG. 3 shows a state of potential in the vertical shift register forming the imaging section 2*i*. FIG. 3 sequentially shows the potential distribution at time points t1 to t4 in a vertical line. The part (a) in FIG. 3 shows a potential change along the channel at each time point, and the part (b) in FIG. 3 shows a potential change taken along line X-X of FIG. 1 at a position of the transfer electrode 12-2 to which a vertical transfer clock $\phi_{f2}$ is applied. In each potential distribution diagram, the vertical axis indicates potential, with the positive potential increasing in the downward direction. Further, FIG. 4 is a timing chart, corresponding to the operation in FIG. 3, of the vertical transfer clock $\phi_{f1}$ to $\phi_{f3}$ and a discharge clock $\phi_b$ applied to the drain region 54.

In this example, a potential well is created in the channel region 50 adjacent to the first region 60 of the separation region 56, and information charges generated by photoelectric conversion are accumulated in the potential well. Specifically, at time point $t_1$, a vertical transfer clock $\phi_{f2}$ is raised to H level and an empty potential well 150 is created in the N well 98 located beneath the transfer electrode 12-2. With regard to the channel direction, because of the clock pulses $\phi_{f1}$ and $\phi_{f3}$ at L level, a shallow potential well created beneath the transfer electrodes 12-1 and 12-3 provides a barrier, which separates adjacent potential wells 150 from each other (see (a) in FIG. 3). Further, with regard to the direction orthogonal to the channel, the separation region 56 (P$^+$ diffusion layer 110) adjacent to the channel region 50 (N well 98) creates a potential barrier between the channel region 50 and the drain region 54 (N$^+$ diffusion layer 108). Here, the separation region 56 corresponds to the first region 60 in the transfer electrode 12-2, and the potential barrier 154 created by the first region 60 is shown by a solid line in the diagram corresponding to $t_1$ (see (b) in FIG. 3). In this drawing, for the purpose of comparison, the potential barrier 156 which would be created by the second region 62 when the clock pulses are raised and a potential well is created beneath the transfer electrodes 12-1 and 12-3 is shown as a dotted line. Further, in the drawing corresponding to time $t_1$, the peak levels 158, 160 of the potential barriers 154, 156, respectively, are also shown as dotted lines (see (a) in FIG. 3). The peaks of the potential barriers 154, 156 are higher than the barrier potential 152. In general, the potential barrier 154 of the first region 60 is the same as or somewhat lower than the potential barrier 156 of the second region 62.

Information charges generated in and near the transfer electrode 12-2 are collected in the potential well 150, gradually reducing the height of the potential well 150. When a pixel is exposed to high intensity incident light, it is possible that the potential beneath the transfer electrode 122 will approximate the barrier potential 152 beneath the adjacent transfer electrodes 12-1 and 12-3, as shown by the information charge 164 accumulated in the potential well 150 in the drawing corresponding to $t_2$. When the potential well 150 is completely filled with electrons, additionally generated information charges are diffused into the potential well under the adjacent transfer electrodes 12-1 and 12-3 and then reach the potential well of another pixel. This is, as noted earlier, referred to as "blooming". In order to prevent such blooming, a lateral overflow drain structure is employed here.

Figure 4:
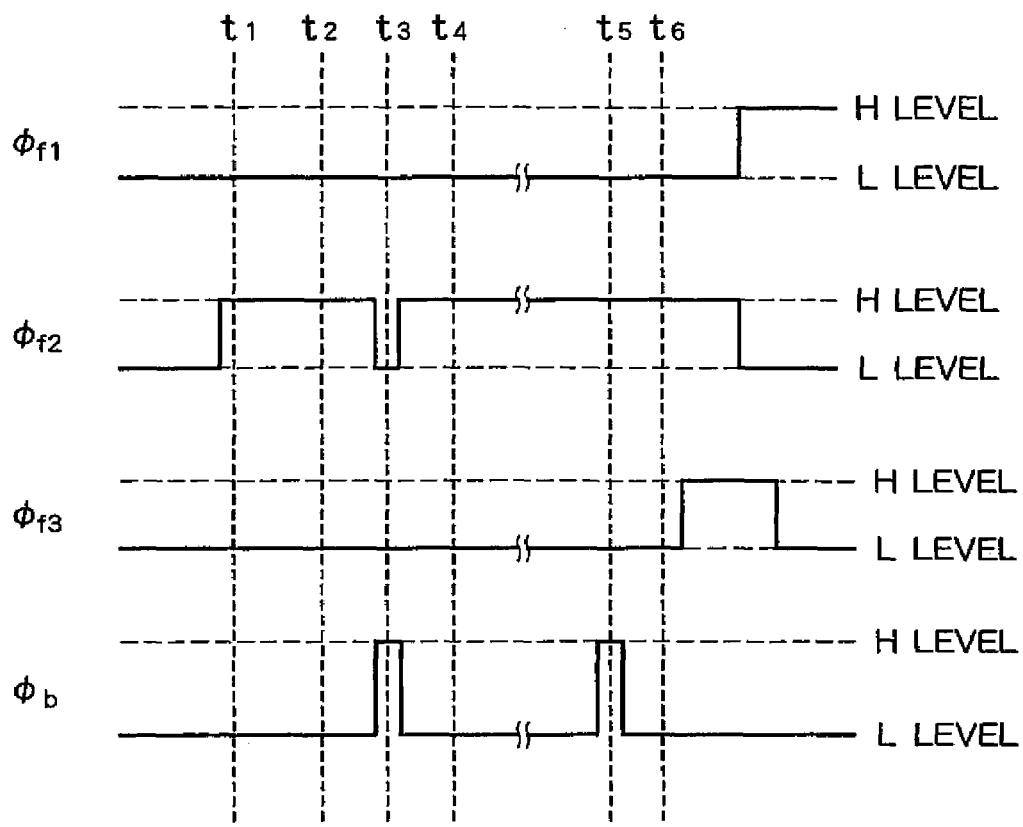
FIG. 4 is a timing chart of clock pulses $\phi_1$ to $\phi^3$ and a drain voltage signal $V_{dr}$ applied to the drain region 54 in accordance with the operation shown in FIG. 3.

As shown in FIG. 4, at t3, a discharge clock $\phi_b$ applied to the drain region 54 rises from L level to H level, and a vertical transfer clock $\phi_{f2}$ applied to the transfer electrode 12-2 falls from H level to L level, such that an electronic shutter operation is performed. Consequently, as shown in the drawing corresponding to time $t_3$ (see (b) in FIG. 3), the potential of the channel region 50 is lowered to be shallow and then disappears, while the potential barrier of the first region 60 is simultaneously lowered. This causes the information charges accumulated in the potential well 150 of the channel region 50 to be collectively discharged into the drain region 54. Because the width of the first region is narrow and the potential peak of the first region is originally low, it is sufficient that the discharge clock $\phi_b$ can rise to a voltage which would lower the potential barrier having a low peak as described above. It is therefore possible to reduce the H level voltage to a voltage lower than when the separation region is configured to have a fixed width for the entire region as in the conventional device. As described above, according to the device of the present embodiment, it is possible to perform an electronic shutter operation using a discharge clock $\phi_b$ with a low voltage, thereby reducing power consumption.

Specifically, a potential well is created at a portion of the channel region 50 adjacent to the first region 60 which corresponds to a portion of the separation region 56 having a narrower width, and the information charge generated by photoelectric conversion is accumulated in this potential well. Consequently, when excess information charges are generated due to a large amount of incident light or the like, for example, due to the fact that the first region 60 is provided adjacent to the potential well, discharging of excess charges can be controlled easily and efficiently.

After the electronic shutter operation is completed, an accumulation period starts in which, as shown in FIG. 4, a discharge clock $\phi_b$ falls to L level and at the same time a vertical transfer clock $\phi_{f2}$ rises to H level once again. Consequently, as shown in the drawing corresponding to $t_4$ in FIG. 3, the potential well 150 is created and the potential barriers of the first region 60 and the second region 62 are created. Thus, an information charge generated after completion of the electronic shutter operation is accumulated in the potential well 150, resulting in a state similar to that obtained at $t_2$.

At time $t_5$, a discharge clock $\phi_b$ applied to the drain region 54 rises from L level to H level. The potential barrier created by the separation region 56 is modulated by a voltage applied to the drain region 54. More specifically, while at the timing when the discharge clock $\phi_b$ is at L level, the potential barrier 154 is generated in the first region 60 as described above, when the discharge clock $\phi_b$ rises to H level, the potential barrier is lowered. This state is shown in the drawing corresponding to t5 in FIG. 3, in which a potential barrier 166 which is lower than both the potential barrier 154 and the barrier potential 152 is created in the first region 60. This drawing also shows, for comparison, a potential barrier 168 which would be created by the second region 62 when the vertical transfer clocks $\phi_{f1}$ and $\phi_{f3}$ fall to L level and the potential well is formed under the transfer electrodes 12-1 and 12-3. Further, the drawing corresponding to $t_5$ in FIG. 3 shows the peak potential levels 170 and 172 of the potential barriers 166 and 168, respectively, as dotted lines. By raising the discharge clock $\phi_b$ to H level in a state where the vertical transfer clock $\phi_{f2}$ is held at H level, the potential barrier of the first region 60 is lowered below the barrier potential 152.

In this manner, of the information charges accumulated in the potential well 150, the information charges exceeding the potential level 170 are discharged into the drain region 54, thereby limiting the amount of charges accumulated.

As described above, by limiting the amount of information charges accumulated in the potential well 150, it is possible to prevent the information charge from spilling over into the drain region during the transfer of the information charges. Specifically, in the separation region adjacent to the channel region 50 serving as a transfer path, the first region 60 creates a thin potential barrier which makes the information charge more likely to spill into the drain region 54 than in the second region 62. In such a case, the charge amount of information charges passing through the portion of the first region 60 most often during transfer is decreased. In order to prevent such decrease in the charge amount, the amount of charge accumulation is limited prior to the transfer of information charge, thereby preventing the accumulated charges from spilling into the drain region 54 during transfer of the information charge. In this manner, it is possible to transfer the information charges without deteriorating the transfer efficiency.

Figure 6:
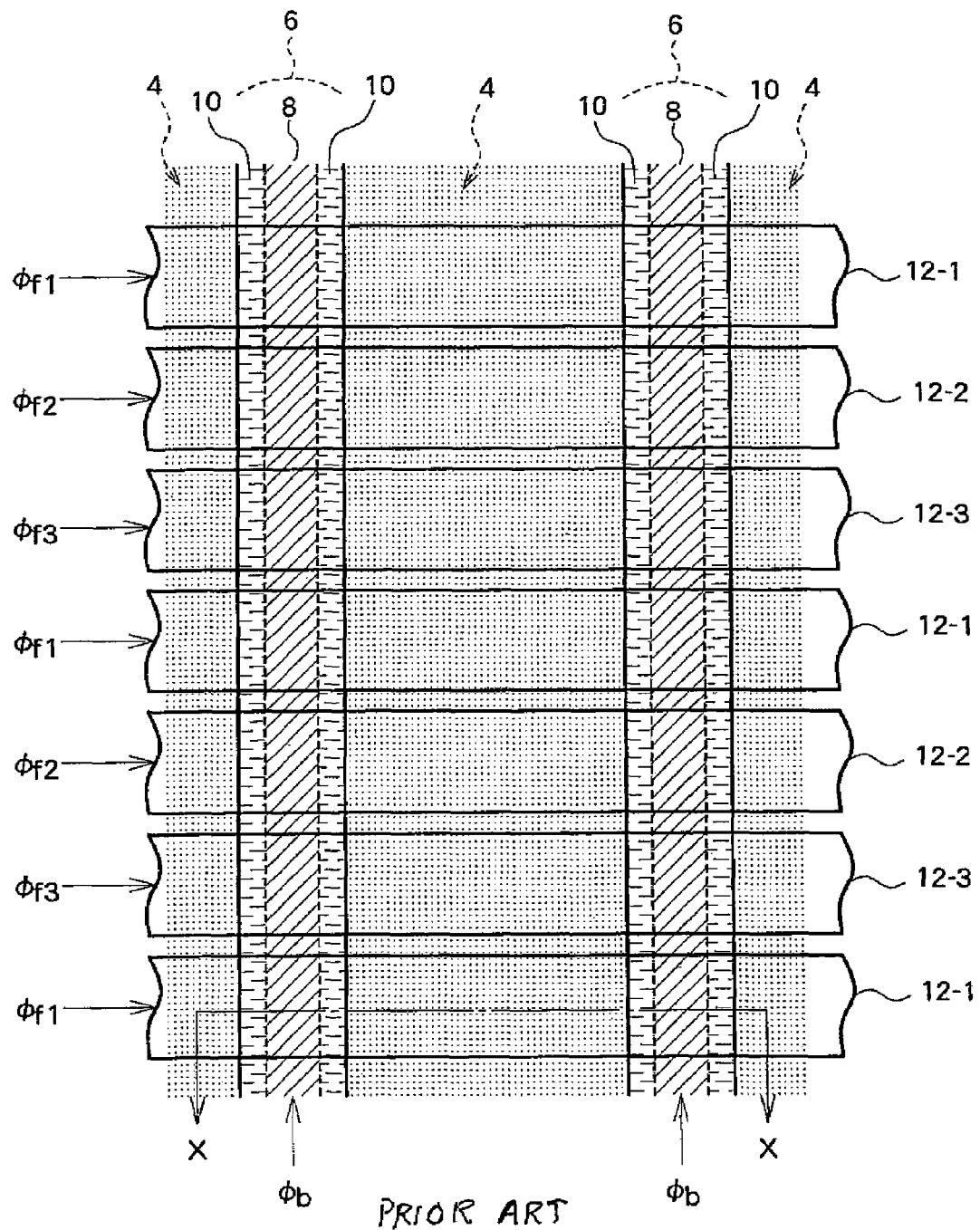
FIG. 6 is a schematic plan view showing a part of an imaging section or a storage section of a conventional frame transfer CCD solid state imaging device employing a lateral overflow drain structure.
Figure 7A:
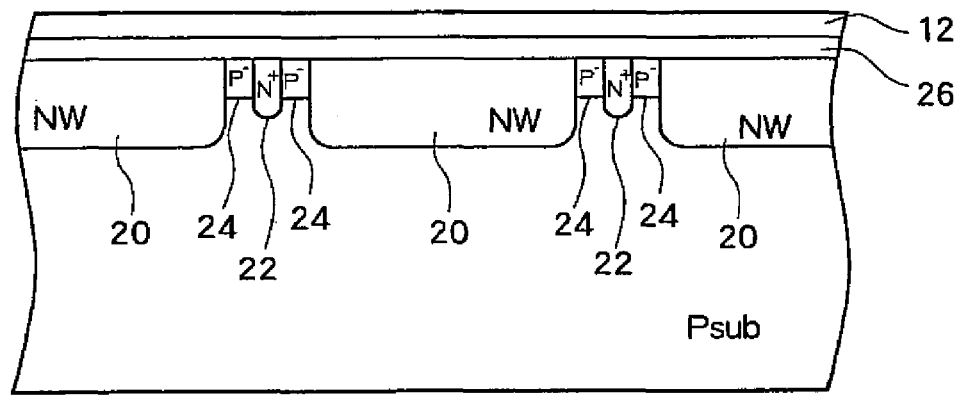
FIG. 7A is a cross sectional view schematically showing, in the direction orthogonal to the charge transfer direction, a vertical shift register in which a lateral overflow drain is provided.
Figure 7B:
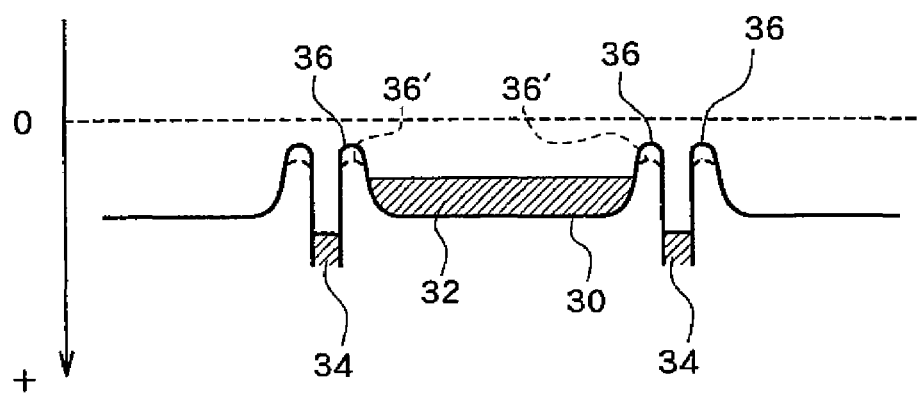
FIG. 7B is a potential distribution diagram of a portion corresponding to the cross section of FIG. 7A.

In the above described example of the embodiment, the first region 60 having a narrower width and the second region 62 having a wider width are formed in such a manner the portion of the separation region 56 which is jointed to the channel region 50 includes a convex or concave portion, as shown in FIG. 1. The present invention, however, is not limited to such a configuration, and it is also possible to form the first region 60 and the second region 62 by changing the width of the drain region 54 while the portion of the separation region 56 which is jointed to the channel region 50 is of linear shape, as shown in FIG. 6.

Further, while in the above example three-phase driving was described as a driving method, the present invention can also employ four or greater phase driving. In the case of four-phase driving, for example, the first region 60 may be formed in the region beneath the one transfer electrode of the four transfer electrodes forming one pixel, or may be formed in the region located beneath two of the four transfer electrodes.

According to the solid state imaging device and the driving method thereof in accordance with the present embodiment, in a lateral overflow drain structure, the separation region includes a portion having a narrower width and charge is discharged from this portion, so that a voltage pulse to be applied to the drain region for charge discharging can be reduced to thereby decrease power consumption of the device. In this case, because other portions of the separation region have a wider width, it is possible to prevent the information charge from spilling from the channel region, thereby securing the transfer efficiency.

While the preferred embodiment of the present invention has been described using specific terms, such description is for illustrative purposes only, and it is to be understood that changes and variations may be made without departing from the spirit or scope of the appended claims.

What is claimed is:

1. A solid state imaging device comprising:
   channel regions of one conductivity type arranged to extend along a first direction in parallel to each other with predetermined intervals on one surface of a semiconductor substrate;
   a plurality of drain regions of the one conductivity type at high density, which are arranged to extend along the first direction between adjacent channel regions;
   a plurality of separation regions disposed in the interval between one of the channel regions and one of the drain regions; and
   a plurality of transfer electrodes arranged in parallel to each other to extend along a second direction which intersects the first direction on the semiconductor substrate,
   wherein the width of the separation region is narrower in a region beneath at least one transfer electrode in each predetermined set of transfer electrodes than in a region beneath the remaining transfer electrodes in the set of transfer electrodes.

2. A solid state imaging device according to claim 1, wherein
   each set of a predetermined number of transfer electrodes among the plurality of transfer electrodes defines a single light receiving pixel in each of the plurality of channel regions.

3. A method of driving a solid state imaging device comprising a plurality of channel regions arranged on one surface of a semiconductor substrate in parallel to each other and separated by predetermined intervals, a plurality of drain regions each provided between the adjacent channel regions, a plurality of separation regions each provided in an interval between one of the channel regions and one of the drain regions, and a plurality of transfer electrodes provided on the semiconductor substrate, the width of the separation region being narrower in a region beneath at least one transfer electrode in each predetermined set of transfer electrodes than in a region beneath the remaining transfer electrodes in the set of transfer electrodes,
   the method comprising the steps of:
   rising a first clock pulse to be applied to a transfer electrode which is formed on the part of the separation region having a narrower width in order to accumulate information charges in the channel region adjacent to the part of the separation region having the narrower width; and
   applying a clock pulse which periodically changes potential to the plurality of transfer electrodes in order to transfer the information charges accumulated in the above accumulation step.

4. A method of driving a solid state imaging device according to claim 3, further comprising, during the transfer step, the step of:

rising a second clock pulse to be applied to the drain region while the first clock pulse is held at high level in order to discharge a portion of the information charges accumulated in the accumulation step into the drain region and limit the amount of charges accumulation in the channel region.

5. A method of driving a solid state imaging device according to claim 3, further comprising the step of:

lowering the first clock pulse and rising the second clock pulse applied to the drain region in order to discharge the information charges accumulated in the accumulation step into the drain region.

* * * * *